(12) United States Patent
Kim

(10) Patent No.: US 6,362,501 B1
(45) Date of Patent: Mar. 26, 2002

(54) DRAM CELL ARRAY NOT REQUIRING A DEVICE ISOLATION LAYER BETWEEN CELLS

(75) Inventor: Kwan Kim, Cheongju (KR)

(73) Assignee: Hyundai Electronics Industries Co., Ltd., Kyoungki-Do (KR)

( * ) Notice: Subject to any disclaimer, the term of this patent is extended or adjusted under 35 U.S.C. 154(b) by 0 days.

(21) Appl. No.: 09/458,699

(22) Filed: Dec. 13, 1999

(30) Foreign Application Priority Data

May 18, 1999 (KR) .............................. 99-17812

(51) Int. Cl.[7] ...................... H01L 27/108; H01L 29/76; H01L 29/94; H01L 31/119
(52) U.S. Cl. .................. 257/296; 257/303; 257/308
(58) Field of Search ................... 257/296, 300, 257/303, 306, 307, 308, 906, 907, 908; 438/241, 253, 258, 396

(56) References Cited

U.S. PATENT DOCUMENTS

| | | | |
|---|---|---|---|
| 5,903,026 A | | 5/1999 | Gonzalez ..................... 257/314 |
| 5,930,621 A | * | 7/1999 | Kang et al. .................. 438/253 |
| 6,008,085 A | * | 12/1999 | Sung et al. .................. 438/253 |
| 6,074,918 A | * | 6/2000 | Lee ............................. 438/283 |
| 6,150,689 A | * | 11/2000 | Narui et al. ................. 257/306 |

* cited by examiner

*Primary Examiner*—Olik Chaudhuri
*Assistant Examiner*—Hoai Pham
(74) *Attorney, Agent, or Firm*—Morgan, Lewis & Bockius LLP

(57) ABSTRACT

The present invention relates to a DRAM cell array and a fabrication method thereof, and which includes: a semiconductor substrate on which a plurality of active regions and isolation regions in a rectangular strip shape at a predetermined distance from each other are defined; a plurality of transistors each having a gate electrode formed by interleaving a gate insulating film on the active regions and a source and drain region formed in the substrate at both sides of the gate electrodes; a plurality of capacitors connected to one of the source and drain regions, and having a lower electrode and a upper electrode formed by interleaving a capacitor insulating film on the lower electrode; a plurality of bit lines connected to one of the source and drain regions of the plurality of transistors; and a plurality of word lines comprised of first word lines and second word lines arranged in parallel which are vertical to the direction in which the bit lines are arranged, and selectively connect the gate electrodes of the transistors.

11 Claims, 7 Drawing Sheets

DRAM CELL ARRAY NOT REQUIRING A DEVICE ISOLATION LAYER BETWEEN CELLS

BACKGROUND OF THE INVENTION

1. Field of the Invention

The present invention relates to a semiconductor memory device, and in particular, to a DRAM cell array which does not require a device isolation layer between cells and a fabrication method thereof.

2. Description of the Conventional Art

Presently, with an increase of memory capacity of Dynamic Random Access Memory(DRAM), the area of a memory device being integrated on a wafer is being reduced, and the area occupied by a transistor and a capacitor is also being reduced at a predetermined ratio.

The basic element of a semiconductor memory circuit is a memory device capable of storing bit of data, that is, a cell. DRAM comprises a plurality of cells, each all being formed of a transistor and a capacitor, and a peripheral circuit capable of reading and writing data onto the cells.

FIGS. 1a to 1c are views showing a conventional DRAM cell array. FIG. 1a is a plan view of a DRAM cell array, FIG. 1b is an equivalent circuit diagram of FIGS. 1a, and FIG. 1c is a cross-sectional view taken along line C—C of FIG. 1a.

Referring to FIG. 1a and 1c, in the conventional DRAM cell array, a semiconductor substrate 1 includes isolation regions 1b and a plurality of active regions 1a in a rectangular island shape formed at a predetermined distance from each other. A plurality of transistors 3 are formed on the active regions 1a, and a field oxide film 2 is formed on the isolation regions 1b.

Transistors 3 each include a plurality of gate electrodes 3b formed by interleaving a gate insulating film 3a on the substrate 1, and a source 3c and drain 3d region formed of n-type dopant in the substrate 1 at both sides of the gate electrodes 3b. As shown therein, two transistors 3 in the active region 1a are connected in series.

In the gate electrodes 3b, polysilicon in a rectangular strip shape at a predetermined distance from each other is deposited in a direction vertical to the 10 arrangement of the active regions 1a, and the gate electrodes serve as word lines 9.

A first interlayer insulating film 5 which has contact holes 5a exposing one of the source 3c and drain 3d regions of the transistors 3 is formed on the entire surface of the substrate 1 and transistors 3.

A plurality of capacitors 6 are formed on the first interlayer insulating film 5. The capacitors 6 each include a lower electrode 6a formed on an upper surface of the first interlayer insulating film 5 and in the contact holes 5a in a fin structure, and an upper electrode 6c formed by interleaving a capacitor insulating film 6b on the lower electrode 6a.

A plurality of bit lines 8 selectively connected to one of the source 3c and drain 3d regions of the transistors 3 are arranged in parallel, and a plurality of word lines 9 selectively connecting the gate electrodes 3b of the transistors 3 are arranged in parallel so as to be vertical to the arrangement of the bit lines 8. The bit lines 8 are connected selectively with one of the source 3c and drain 3d regions of the transistor 3 via bit line contact holes 7a of a second interlayer insulating film 7.

A device isolation insulating film, that is, a field oxide film 2 is formed on the semiconductor substrate 1 between the neighboring transistors in a direction that the bit lines 8 are arranged.

The read/write operation of the above-described conventional DRAM cell array will be explained as follows.

When a high voltage is applied to the word lines 9 and bit lines 8, a corresponding transistor is turned on, thereby forming a data charge transmission path(channel) on a lower part of the gate region. The data charges transmitted from the bit lines 8 are transmitted to a storage electrode forming the lower electrode 6a of the capacitor 6 through source regions 3c, channels, and drain regions 3d.

In addition, in order to read each bit, a sensor amplifier (not shown) measures the amount of charges flowing into the capacitors 6, and decides whether a data charge is stored in the capacitor 6(that is, '0' state) or not(that is, '1' state). Then, the capacitor 6 is refreshed by fully filling the charges or emptying the same again.

The above-described conventional DRAM cell array has the following problems.

First, as the degree of integration of a memory device increases, the area of the active regions accepting each transistor becomes smaller, and thereby the shape of the active regions formed on the substrate becomes close to a circular form due to the technical problems in photolithography andetching process.

Second, as the area of wiring lines and capacitors connected with the active regions decreases, misalignments such as an over-contact arise, resulting in the decrease in the reliability of the device.

Third, the active regions are formed in a form of island, and the isolation regions needed for implementing an insulation between the active regions occupy a lot of space on the substrate, so that there is a difficulty in enhancing the degree of integration of the device.

SUMMARY OF THE INVENTION

Accordingly, to solve the above problems, it is an object of the present invention to define active regions on a substrate in a strip form to thereby minimize the area occupied by isolation regions, and provide a DRAM cell array that improve the degree of integration of a memory device by implementing an insulation between transistors formed in the active regions through additional word lines.

To achieve the above object, a DRAM cell array according to the present invention is characterized by the structure which includes: a semiconductor substrate on which a plurality of active regions and isolation regions are formed in a rectangular strip shape at a predetermined distance; a plurality of transistors each having a gate electrode formed by interleaving a gate insulating film on the active regions and a source and drain region formed in the substrate at both sides of the gate electrodes; a plurality of capacitors connected with one of the source and drain regions of the plurality of transistors and having a lower electrode and a upper electrode formed by interleaving a capacitor insulating film on the lower electrode, and a plurality of bit lines connected with one of the source and drain regions of the plurality of transistors and arranged in parallel; and a plurality of word lines formed of first word lines and second word lines vertical to the direction in which the bit lines are arranged.

Also, to achieve the above-described object, there is provided a fabrication method for a DRAM cell array according to the present invention which includes: defining active regions and isolation regions in a rectangular strip shape at a predetermined space on a semiconductor substrate; forming a plurality of gate electrodes which have interleaved a gate insulating film on the active regions; forming a source and drain region in the substrate at both sides of the gate electrodes in order to form a plurality of transistors; forming a plurality of lower electrodes connected with one of the source and drain regions of the transistors on the substrate on which the transistors are formed; forming an upper electrode interleaved by a capacitor insulating film on the lower electrode in order to form a plurality of capacitors; forming a plurality of bit lines in parallel connected with one of the source and drain regions of the transistors on the substrate on which the capacitors are formed; and forming a plurality of word lines formed of first word lines and second word lines which are vertical to the direction in which the bit lines are arranged and selectively connected with the gate electrodes 32 of the transistors 30.

BRIEF DESCRIPTION OF THE DRAWINGS

FIGS. 1a through 1c are view showing a conventional DRAM cell array, in which:

FIG. 1a is a plan view of a DRAM cell array;

FIG. 1b is a equivalent circuit diagram of FIG. 1a; and,

FIG. 1c is a cross-sectional view of FIG. 1a taken along line C—C;

FIGS. 2a through 2c are views showing a DRAM cell array according to the present invention, in which:

FIG. 2a is a plan view of a DRAM cell array;

FIG. 2b is an equivalent circuit diagram of FIG. 2a; and,

FIG. 2c is a cross-sectional view of FIG. 2a taken along line C—C;

FIGS. 3a and 3b are views showing a first fabrication step of a DRAM cell array according to the present invention, in which:

FIG. 3a is a plan view of a DRAM cell array; and,

FIG. 3b is a cross-sectional view of FIG. 3a taken along line B—B;

FIGS. 4a and 4b are views showing a second fabrication step of a DRAM cell array according to the present invention, in which:

FIG. 4a is a plan view of a DRAM cell array; and,

FIG. 4b is a cross-sectional view of FIG. 4a taken along line B—B;

FIGS. 5a and 5b are views showing a third fabrication step of a DRAM cell array according to the present invention, in which:

FIG. 5a is a plan view of a DRAM cell array; and,

FIG. 5b is a cross-sectional view of FIG. 5a taken along line B—B.

DETAILED DESCRIPTION OF THE INVENTION

Figure 1A:
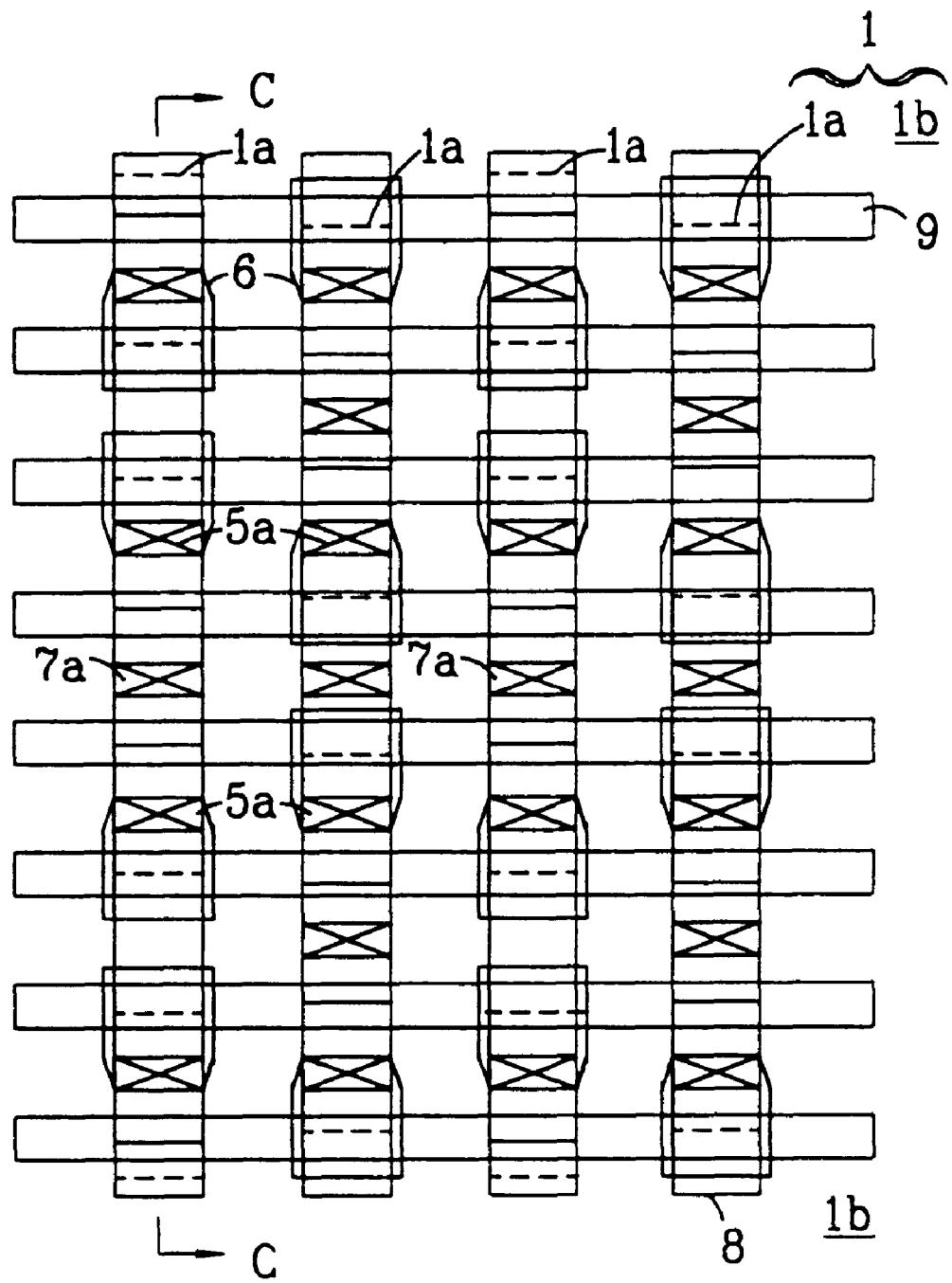
Figure 1B:
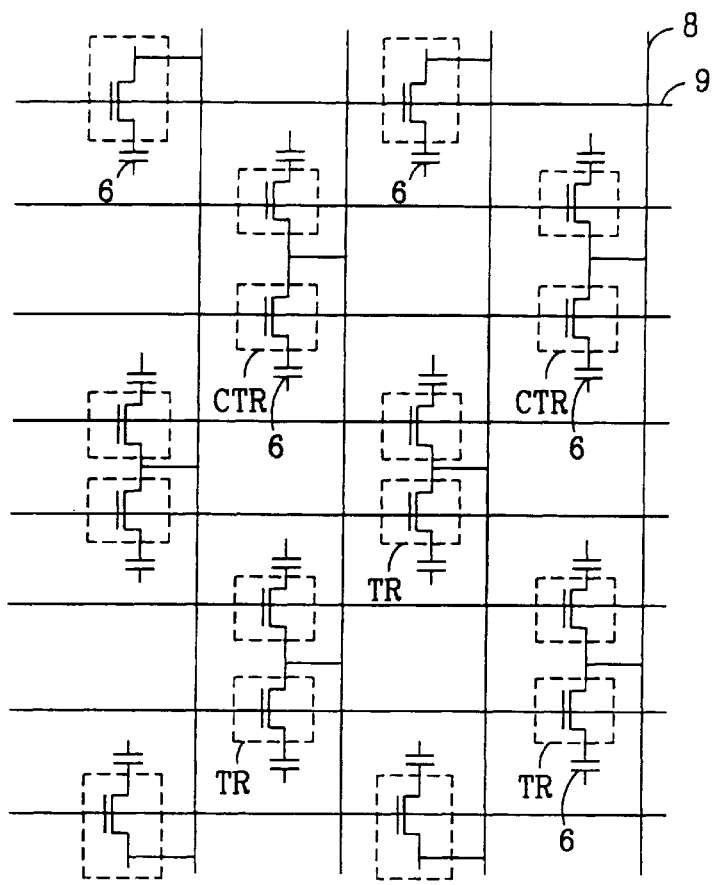
Figure 1C:
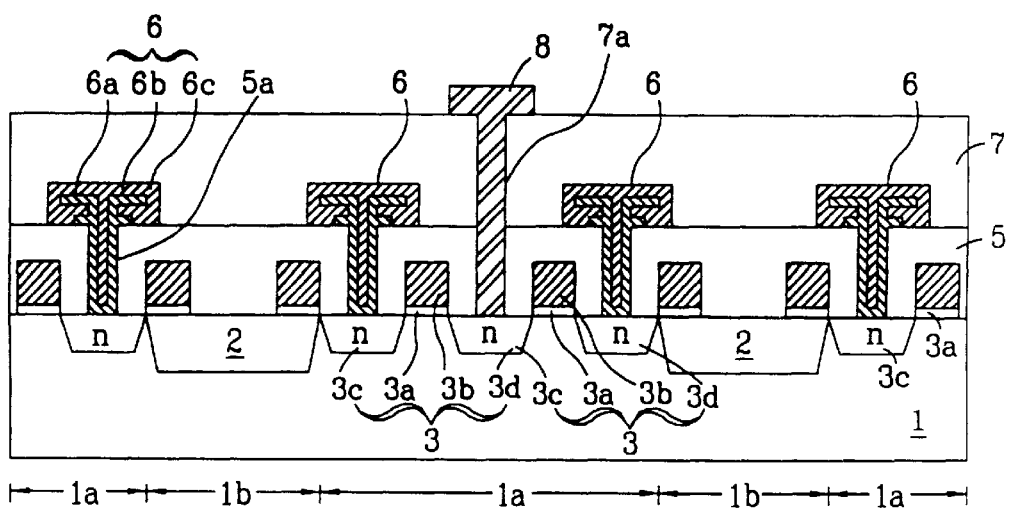
Figure 2A:
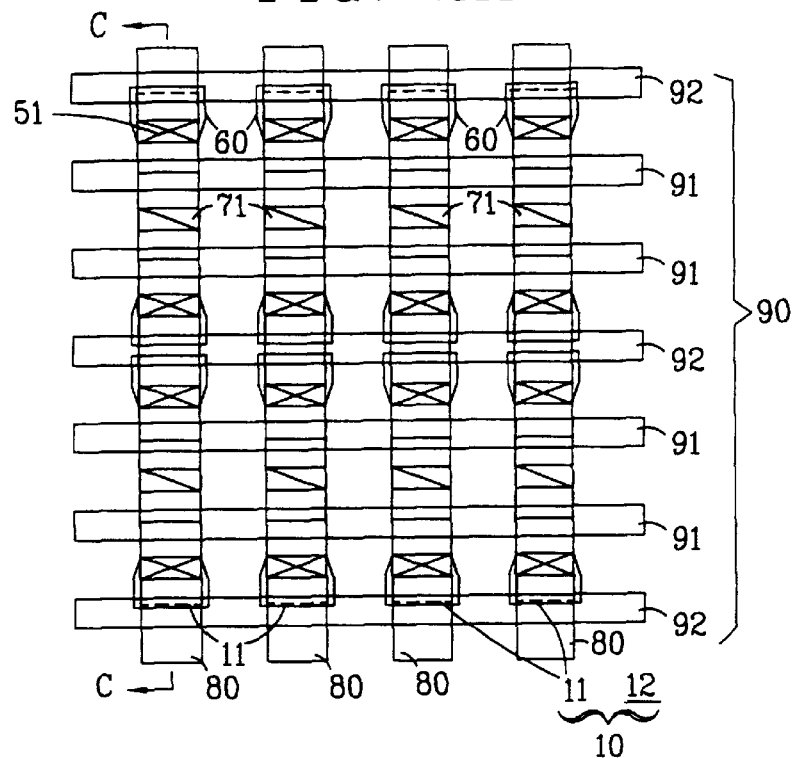
Figure 2B:
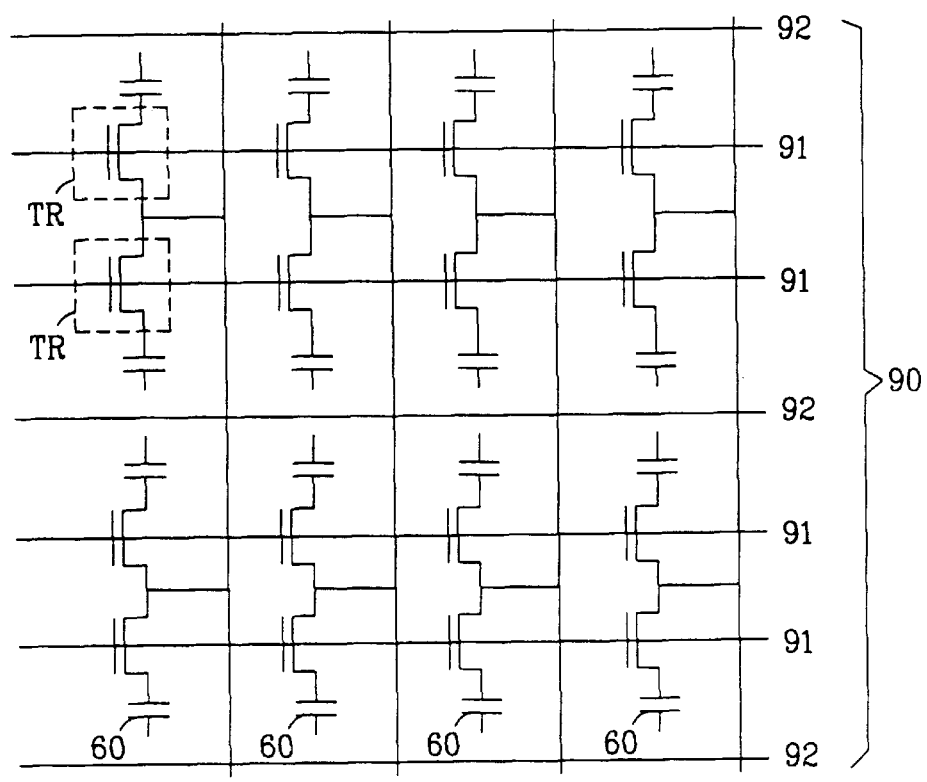
Figure 2C:
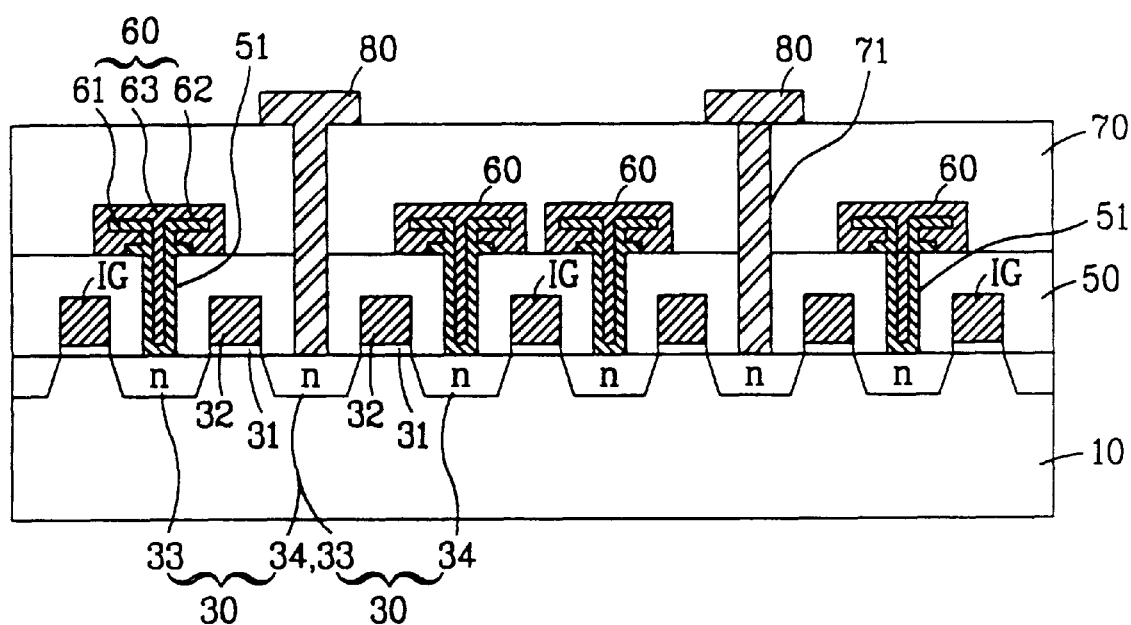

FIGS. 2a and 2c are views showing a DRAM cell array according to the present invention. FIG. 2a is a plan view of a DRAM cell array, FIG. 2b is a equivalent circuit diagram of FIG. 2a, and FIG. 2c is a cross-sectional view of FIG. 2a taken along line C—C.

With reference to FIGS. 2a through 2c, in a DRAM cell array according to the present invention, a semiconductor substrate 10 includes isolation region 12 and active regions 11 which are formed in a rectangular strip shape at a predetermined distance from each other in a first direction. A plurality of transistors 30 is formed on the active regions 11, and a field oxide film(not shown) is formed on the isolation region 12.

Each of the transistors 30 has a gate electrode 32 formed by interleaving a gate insulating film 31 on the active regions 11, and a source 33 and drain 34 region formed of n-type dopant in the substrate 10 at both sides of the gate electrodes 32, and as shown in FIGS. 2a through 2c, two transistors 30 in the active region 11 are connected in series.

The gate electrodes 32 are formed by depositing amorphous silicon or polysilicon vertical to the arrangement of the active regions 11. The gate electrodes 32 are formed in a rectangular strip shape at a predetermined distance from each other as well as the active regions 11, and serves as word lines 90.

A first interlayer insulating film 50 which has contact holes 51 exposing one of the source 33 and drain 34 regions of the transistors 30 is formed on the entire surface of the substrate 10 on which the transistors 30 are formed.

A plurality of capacitors 60 which are connected with one of the source 33 and drain 34 regions exposed through the contact holes 51 are formed on the first interlayer insulating film 50. The capacitors 60 each comprise a lower electrode 61 with a fin structure formed on the top surface of the first interlayer insulating film 50 and in the contact holes 51, and an upper electrode 63 formed by interleaving a capacitor insulating film 62 on the lower electrode 61.

A plurality of bit lines 80 connected with one of the source 33 and drain 34 regions of the transistors 30 are arranged in parallel, and a plurality of word lines 90 selectively connecting the gate electrodes 32 of the transistors 30 are arranged in parallel so as to be vertical to the arrangement of the bit lines 80.

The bit lines 80 are connected to one of the source 33 and drain 34 regions of the transistors 30 via bit line contact holes 71 of a second interlayer insulating film 70. The word lines 90 include first word lines 91 connecting the gate electrodes 32 of the neighboring transistors 30 in a direction in which the bit lines 80 are arranged, and second word lines 92 connecting the gate electrodes(IG) arranged on the semiconductor substrate 10 between the transistors 30. The second word lines 92 serve to implement an insulation between the transistors 30.

FIGS. 3a through 5b are views showing a fabrication step of a DRAM cell array according to the present invention as of FIGS. 2a through 2c.

Figure 3A:
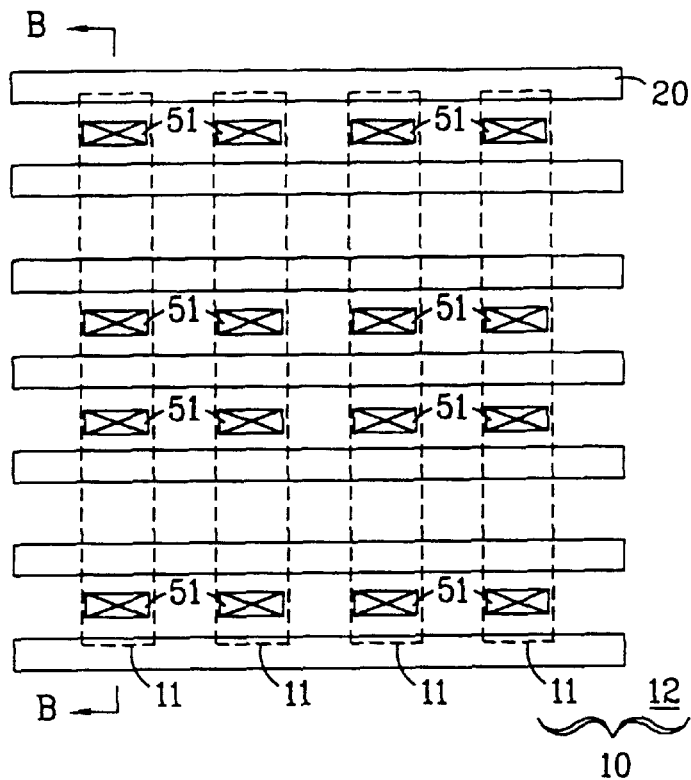
Figure 3B:
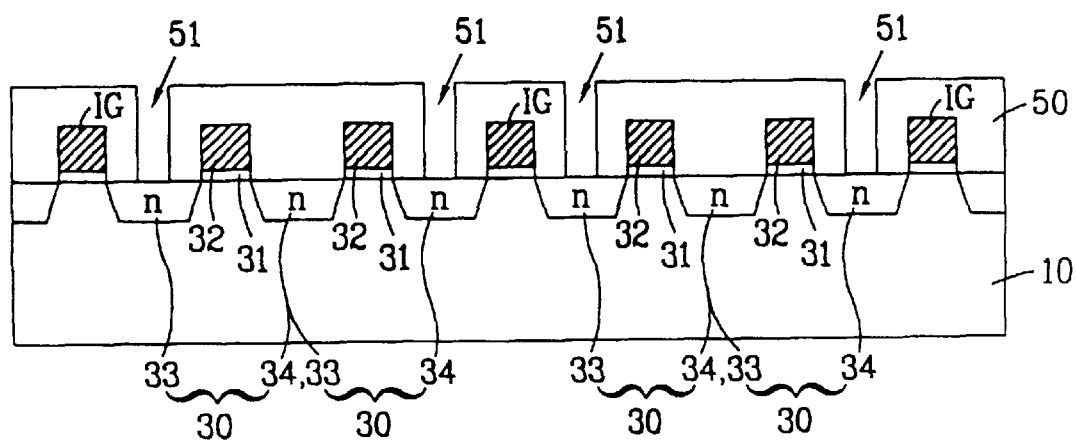

FIGS. 3a and 3b show a first fabrication step of a DRAM cell array according to the present invention. FIG. 3a is a plan view of a DRAM cell array, and FIG. 3b is a cross-sectional view taken along line B—B of FIG. 3a.

Referring to FIGS. 3a and 3b, a plurality of active regions 11 and isolation regions 12 are formed on a semiconductor substrate 10, a plurality of gate electrodes 32 interleaved by a gate insulating film 31 are formed on the active regions 11, and source 33 and drain 34 regions are formed by ion-implanting n-type dopant into the substrate 10 at both sides of the gate electrodes 32 in order to form a plurality of transistors 30.

The active regions 11 are formed in a rectangular strip shape at a predetermined distance from each other, and a field oxide film(not shown) formed by a LOCOS process or a trench process is formed on the isolation regions 12. The field oxide film is formed by self-alignment.

As shown therein, in the transistors 30, amorphous silicon or polysilicon is deposited on the substrate 10 in a rectangular strip shape at a predetermined distance in a direction orthogonal to that of the active regions 11, and two transistors 30 in an active region 11 are connected to the active regions 11 in series.

A first interlayer insulating film 50 which has a plurality of contact holes 51 exposing one of the source 33 and drain 34 regions is formed on the entire surface of the substrate 10.

Figure 4A:
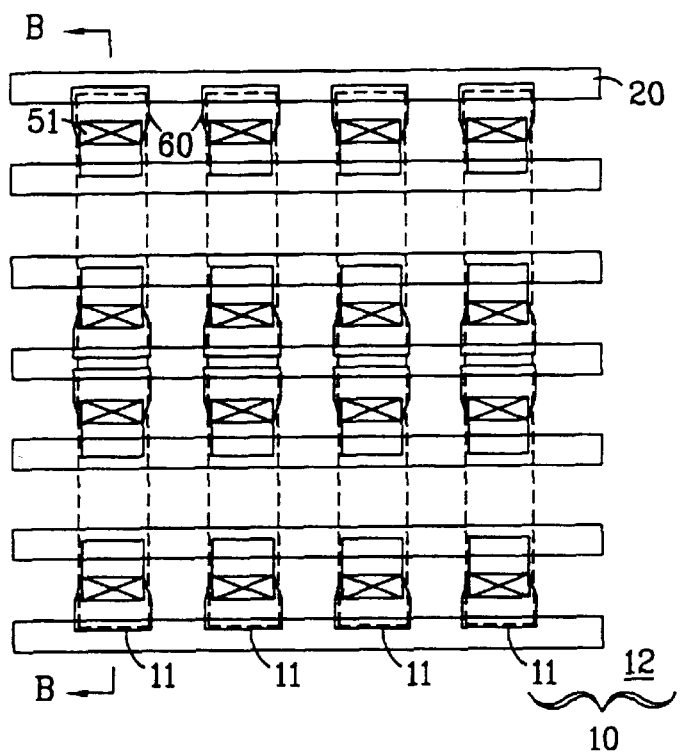
Figure 4B:
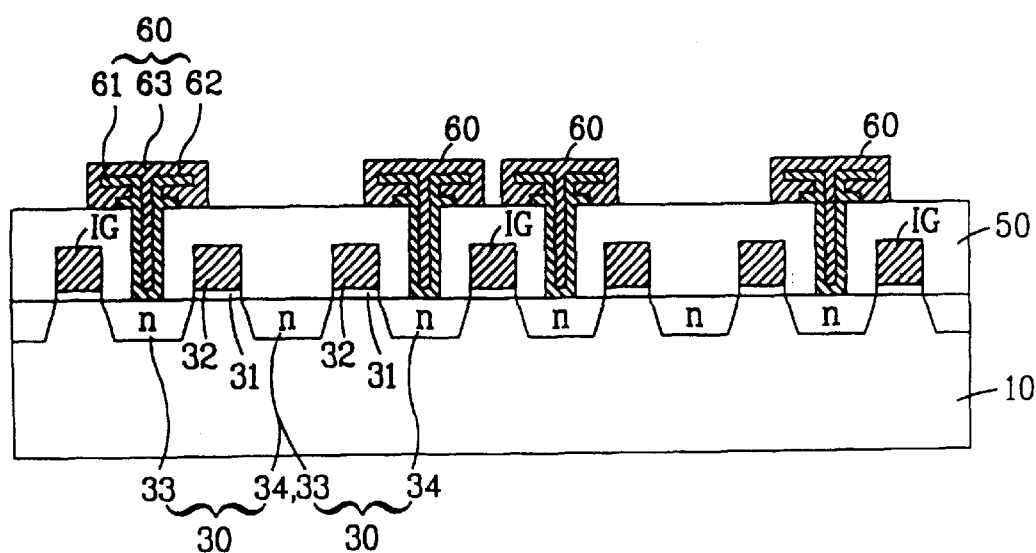

FIGS. 4a and 4b show a second fabrication step of a DRAM cell array according to the present invention. FIG. 4a is a plan view of a DRAM cell array, and FIG. 4b is a cross-sectional view taken along line B—B of FIG. 4a.

Referring to FIGS. 4a and 4b, a plurality of lower electrodes 61 are connected with one of the source 33 and drain 34 regions, and the upper electrodes 63 interleaved by a capacitor insulating film 62 are formed on the lower electrodes 61 in order to form a plurality of capacitors 60.

The lower electrodes 61 of the capacitors 60 are formed by depositing a first conductive film(not shown) on the top surface of the first interlayer insulating film 50 and in the contact holes 51, and patterning the same by etching. The first interlayer insulating film 50 is formed by a Spin-On-Glass(SOG), Borophosphosilicate glass (BPSG), and Plasma Enhanced-Tetraethyl Orthosilicate(PE-TEOS) method mostly.

Figure 5A:
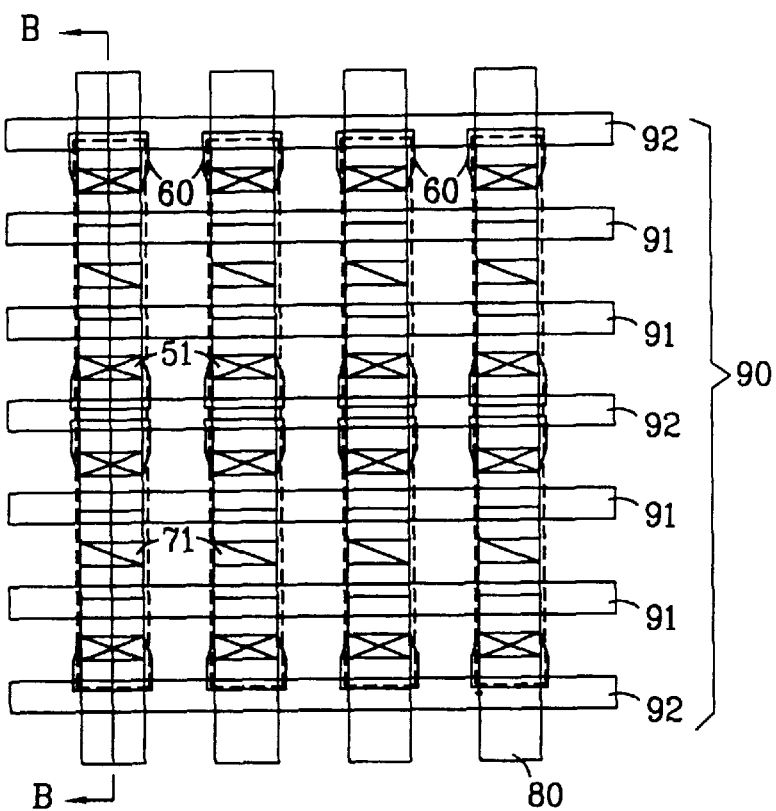
Figure 5B:
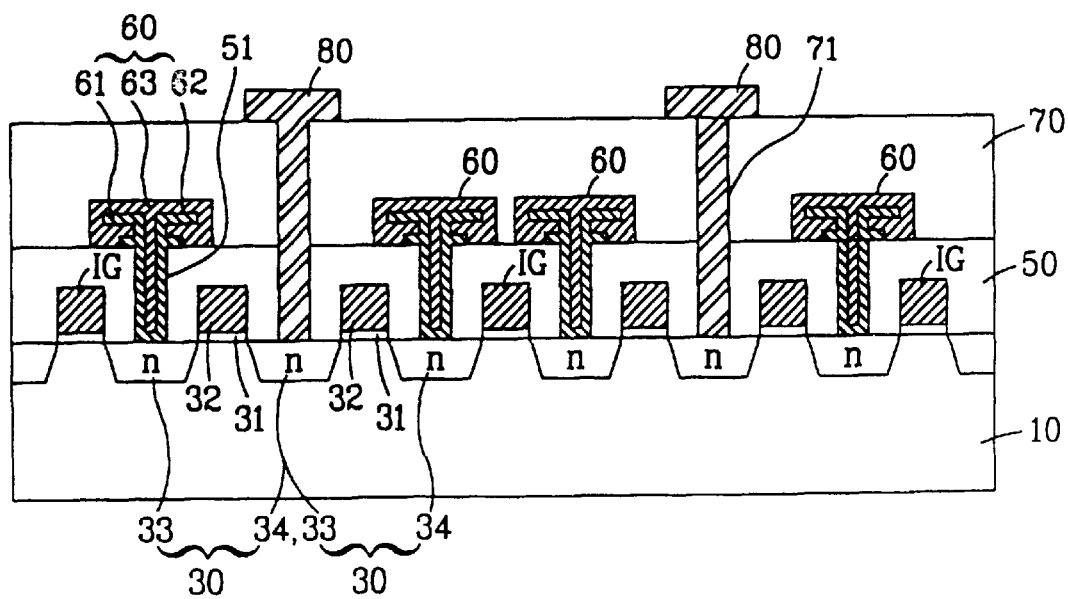

FIGS. 5a and 5b show a third fabrication step of a DRAM cell array according to the present invention. FIG. 5a is a plan view of a DRAM cell array, and FIG. 5b is a cross-sectional view taken along line B—B of FIG. 5a.

Referring to FIGS. 5a and 5b, a plurality of bit lines 80 connected with one of the source 33 and drain 34 regions are formed in parallel on the substrate 10, and a plurality of word lines 90 comprising first word lines 91 and second word lines 92 which are vertical to the arrangement of the bit lines 80 and selectively connected to the gate electrodes 32 are formed.

The bit lines 80 are formed by a method comprising the steps of forming a second interlayer film 70 which has bit line contact holes 71 exposing one of the source 33 and drain 34 regions, and depositing a second conductive film(not shown) on the top surface of the second interlayer insulating film 70 and in the bit line contact holes 71, and patterning the same by etching.

First word lines 91 are connected to the gate electrodes 32 of the neighboring transistors 30 in a direction that the bit lines 80 are arranged, the second word lines 92 are connected to the gate electrodes(IG) arranged on the semiconductor substrate 10 between the transistors 30, and the second word lines 92 serve to implement an insulation between the neighboring transistors.

The read/write operation of the DRAM cell array according to the present invention will now be explained as follows.

When a high voltage is applied to the first word lines 91 and the bit lines 80, retaining a bias voltage applied to the second word lines 92 among the word lines connecting the gate electrodes 32 of the transistors 30 at zero volt, each corresponding transistor 30 is turned "ON", thereby forming a data charge transmission path(channel) on a lower part of the gate region. The data charges transmitted from the bit lines 80 are transmitted to a storage electrode 61 forming the lower electrode of the capacitor 60 through the source regions 33, channels, and drain regions 34.

The reason for applying 0V to the second word lines 92 is to prevent the data charges transmitted from the bit lines 80 from flowing into the source regions 33 of the neighboring transistors 30 by preventing a channel from being formed on the lower part of the gate region corresponding to the second word lines 92.

The DRAM cell array and fabrication method thereof according to the present invention have been described in turns of an example, a NMOS transistor as a cell transistor, and the example is not limited thereto. The present invention will be also applicable to PMOS and CMOS transistors.

In addition, the DRAM cell array and fabrication method thereof according to the present invention have been described in turns of an example, a capacitor with a fin structure, and the example is not limited thereto. This invention is also applicable to a DRAM cell array having a capacitor including a stack and trench architecture.

As described above, the DRAM cell array and fabrication method thereof according to the present invention are suitable for a highly-integrated device by forming the active regions in a rectangular strip shape at a predetermined distance from each other, and have effects of increasing the degree of integration as the area of isolation regions on the substrate which regions implement an insulation between the active regions decreases, and largely improving the chip integration and the production yield by implementing an insulation between the cells of the active regions forming the memory semiconductor device not by ordinary device isolation film but by word lines.

What is claimed is:

1. A DRAM cell array, comprising:

a semiconductor substrate having a plurality of active regions and isolation regions in a rectangular strip shape at a predetermined distance from each other;

a plurality of transistors each having a gate electrode formed on the active regions, and a source and drain region formed in the substrate at both sides of the gate electrodes;

a plurality of capacitors connected to one of the source and drain regions of the plurality of transistors, and having a lower electrode and an upper electrode;

a plurality of transistors each having a gate electrode formed on the active regions, and a source and drain region formed in the substrate at both sides of the gate electrodes;

a plurality of capacitors connected to one of the source and drain regions of the plurality of transistors, and having a lower electrode and an upper electrode;

a plurality of bit lines connected to one of the source and drain regions of the plurality of transistors and arranged in parallel with each other; and a plurality of word lines having first word lines and second word lines arranged in parallel with one another and in a direction perpendicular to a direction in which the bit lines are arranged, wherein the first word lines are connected to the gate electrodes of neighboring transistors and the second word lines are connected to insulating gate electrodes arranged on the substrate between neighboring transistors.

2. The DRAM cell array of claim 1, wherein a field oxide film formed by a Locos process or a trench filled with the field oxide film therein are formed on the isolation regions by self-alignment.

3. The DRAM cell array of claim 1, wherein the transistors formed in the active regions are connected in pairs and in series.

4. The DRAM cell array of claim 1, wherein in the gate electrodes, amorphous silicon or polysilicon in a rectangular strip shape at a predetermined distance from each other is deposited on the substrate in a direction vertical to the arrangement of the active regions.

5. The DRAM cell array of claim 1, wherein the lower electrode of the capacitor comprises a first conductive film pattern deposited in contact holes formed by etching a first interlayer insulating film formed on the entire surface of the substrate on which the plurality of transistors are formed.

6. The DRAM cell array of claim 1, wherein the bit lines comprise:
   a second interlayer insulating film formed on the entire surface of the substrate;
   bit line contact holes exposing one of the source and drain regions of the transistors; and
   a second conductive film pattern deposited on an upper surface of the second interlayer insulating film and in the contact holes.

7. The DRAM cell array of claim 5, wherein the first interlayer insulating film is formed by a SOG, BPSG, or PE-TEOS method.

8. The DRAM cell array of claim 6, wherein the second interlayer insulating film is formed by a SOG, BPSG, or PE-TEOS method.

9. The DRAM cell array of claim 1, wherein the first word lines are connected to the gate electrodes of neighboring transistors in a direction that the bit lines are arranged.

10. The DRAM cell array of claim 1, wherein the second word lines are connected to the insulating gate electrodes arranged on the substrate between neighboring transistors in the direction in which the bit lines are arranged.

11. A DRAM cell array, comprising:
   a semiconductor substrate having a plurality of active regions and isolation regions in a rectangular strip shape at a predetermined distance from each other;
   a plurality of transistors each having a gate electrode formed on the active regions, and a source and drain region formed in the substrate at both sides of the gate electrodes;
   a plurality of capacitors connected to one of the source and drain regions of the plurality of transistors, and having a lower electrode and an upper electrode;
   a plurality of bit lines connected to one of the source and drain regions of the plurality of transistors and arranged in parallel with each other; and
   a plurality of word lines having first word lines and second word lines arranged in parallel with one another and in a direction perpendicular to a direction in which the bit lines are arranged, wherein the first word lines are connected to the gate electrodes of neighboring transistors, and wherein the second word lines are connected to insulating gate electrodes arranged on the substrate between neighboring transistors in the direction in which the bit lines are arranged and serve to implement an insulation between the neighboring transistors and 0V applied during a cell operation.

* * * * *